United States Patent
Matsumoto (10) Patent No.: US 10,754,262 B2
(45) Date of Patent: Aug. 25, 2020

(54) CHUCK, SUBSTRATE-HOLDING APPARATUS, PATTERN-FORMING APPARATUS, AND METHOD OF MANUFACTURING ARTICLE

(71) Applicant: CANON KABUSHIKI KAISHA, Tokyo (JP)

(72) Inventor: Toru Matsumoto, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/204,563

(22) Filed: Nov. 29, 2018

(65) Prior Publication Data

US 2019/0094700 A1    Mar. 28, 2019

Related U.S. Application Data

(63) Continuation of application No. PCT/JP2017/019917, filed on May 29, 2017.

(30) Foreign Application Priority Data

Jun. 1, 2016   (JP) ................. 2016-109651

(51) Int. Cl.
    *G03F 7/20*        (2006.01)
    *H01L 21/683*    (2006.01)

(52) U.S. Cl.
    CPC ............ *G03F 7/707* (2013.01); *G03F 7/20* (2013.01); *H01L 21/683* (2013.01)

(58) Field of Classification Search
    CPC .......... G03F 7/20; G03F 7/707; H01L 21/683
    See application file for complete search history.

(56) References Cited

U.S. PATENT DOCUMENTS

| | | | | |
|---|---|---|---|---|
| 5,324,012 A | * | 6/1994 | Aoyama | ............... B25B 11/005 269/21 |
| 5,374,829 A | * | 12/1994 | Sakamoto | ............... C30B 25/12 250/453.11 |
| 5,563,683 A | | 10/1996 | Kamiya | |
| 5,793,474 A | * | 8/1998 | Nishi | ..................... G03F 7/707 355/53 |
| 5,923,408 A | * | 7/1999 | Takabayashi | ........... G03F 7/707 355/53 |

(Continued)

FOREIGN PATENT DOCUMENTS

| | | |
|---|---|---|
| EP | 2325866 A1 | 5/2011 |
| JP | 4-5646 U | 1/1992 |

(Continued)

*Primary Examiner* — Deoram Persaud
(74) *Attorney, Agent, or Firm* — Canon U.S.A., Inc. IP Division (57) ABSTRACT

A chuck according to an embodiment of the present invention includes first and second support portions 10 each of which has a repetition structure of a convex portion 11 and a concave portion 13 on a base. A substrate is held by bringing each convex portion 11 into contact with the substrate and exhausting gas in each concave portion 13 such that the concave portion 13 has a negative pressure with respect to a space between the first support portion 10 and the second support portion 10. At least one support portion of the first support portion 10 and the second support portion 10 includes at least four convex portions 11 and three concave portions 13.

23 Claims, 11 Drawing Sheets

(56) References Cited

U.S. PATENT DOCUMENTS

| | | | | |
|---|---|---|---|---|
| 6,184,972 | B1* | 2/2001 | Mizutani | G03F 7/707 269/21 |
| 6,664,549 | B2* | 12/2003 | Kobayashi | B25B 11/005 250/440.11 |
| 7,113,262 | B2* | 9/2006 | Van Empel | H01L 21/6875 355/72 |
| 7,791,708 | B2* | 9/2010 | Puyt | G03F 7/707 269/21 |
| 7,889,323 | B2* | 2/2011 | Sung | G03F 7/707 355/72 |
| 8,336,188 | B2* | 12/2012 | Monteen | H01L 21/6838 269/21 |
| 9,013,682 | B2* | 4/2015 | Compen | G03F 7/707 355/30 |
| 2018/0082880 | A1* | 3/2018 | Komine | H01L 21/68735 |

FOREIGN PATENT DOCUMENTS

| | | |
|---|---|---|
| JP | H05-021584 A | 1/1993 |
| JP | 05-235151 A | 9/1993 |
| JP | 6-196381 A | 7/1994 |
| JP | 08-031719 A | 2/1996 |
| JP | 08-051143 A | 2/1996 |
| JP | 2015-038982 A | 2/2015 |
| WO | 2014/171584 A1 | 10/2014 |

\* cited by examiner

CHUCK, SUBSTRATE-HOLDING APPARATUS, PATTERN-FORMING APPARATUS, AND METHOD OF MANUFACTURING ARTICLE

CROSS-REFERENCE TO RELATED APPLICATIONS

This application is a Continuation of International Patent Application No. PCT/JP2017/019917, filed May 29, 2017, which claims the benefit of Japanese Patent Application No. 2016-109651, filed Jun. 1, 2016, both of which are hereby incorporated by reference herein in their entirety.

TECHNICAL FIELD

The present invention relates to a chuck, a substrate-holding apparatus, a pattern-forming apparatus, and a method of manufacturing an article.

BACKGROUND ART

In a substrate-holding apparatus with which a lithography apparatus or another apparatus is equipped, good flatness of a substrate needs to be maintained to focus exposure light accurately.

PTL 1 discloses that the upper surface of a chuck is divided into rectangular sections by using a support portion that includes two convex portions and a concave portion therebetween. PTL 1 discloses that gas in the concave portion is exhausted to hold a substrate, and the amount of gas that is supplied to and exhausted from the rectangular sections is controlled in accordance with the result of measurement of the flatness of the substrate held, so that the flatness of the substrate is corrected.

CITATION LIST

Patent Literature

PTL 1 Japanese Patent Laid-Open No. 6-196381

SUMMARY OF INVENTION

A substrate having a decreased thickness is increasingly used. There is a risk that the flatness of the front surface of the substrate is degraded due to contact between the chuck and the substrate when the substrate is held by exhaust depending on the structure of a portion of the chuck that comes into contact with the back surface of the substrate.

In view of this, it is an object of the present invention to provide a chuck, a substrate-holding apparatus, and a lithography apparatus that enable the flatness of a substrate that is held to be improved.

A chuck according to an embodiment of the present invention includes first and second support portions each of which has a repetition structure of a convex portion and a concave portion on a base. A substrate is held by bringing each convex portion into contact with the substrate and exhausting gas in each concave portion such that the concave portion has a negative pressure with respect to a space between the first support portion and the second support portion. At least one support portion of the first support portion and the second support portion includes at least four of the convex portions and three concave portions.

Further features of the present invention will become apparent from the following description of exemplary embodiments with reference to the attached drawings.

DESCRIPTION OF EMBODIMENTS

First Embodiment

Figure 1:
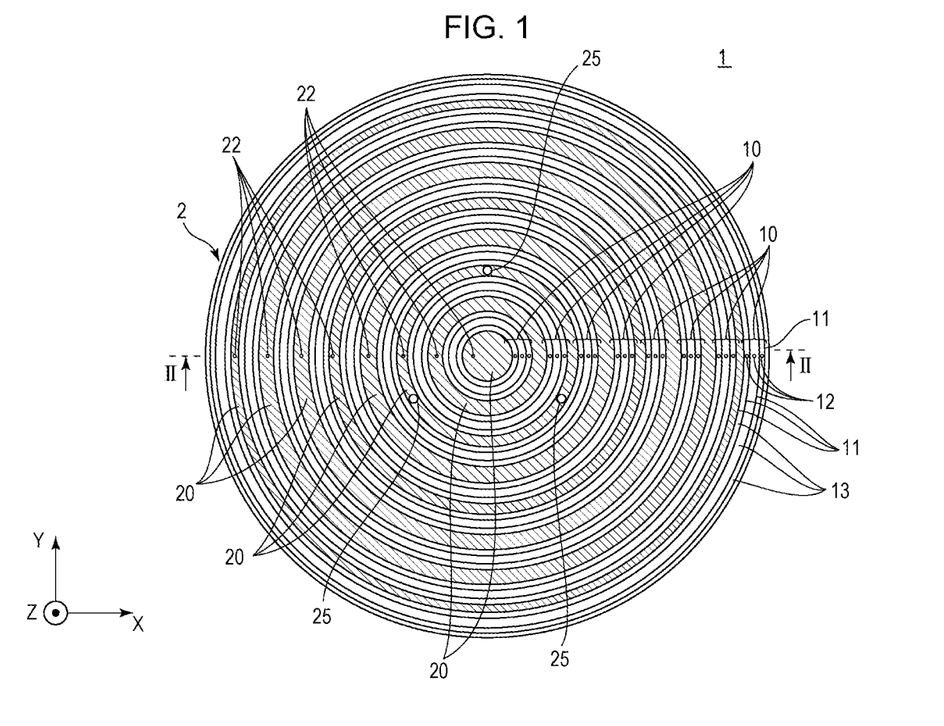
FIG. 1 illustrates a chuck according to a first embodiment viewed in the direction of +Z.
Figure 2:
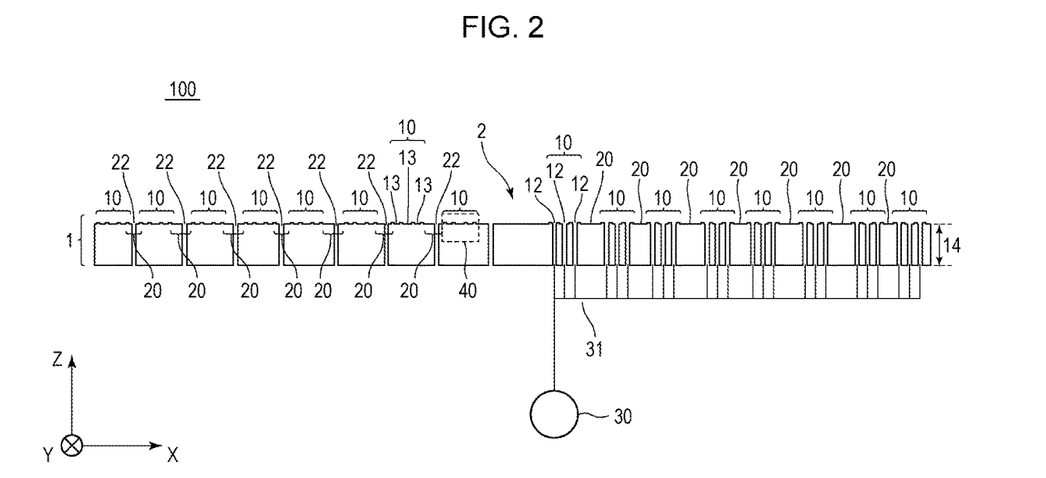
FIG. 2 illustrates the structure of a holding apparatus according to the first embodiment.
Figure 3:
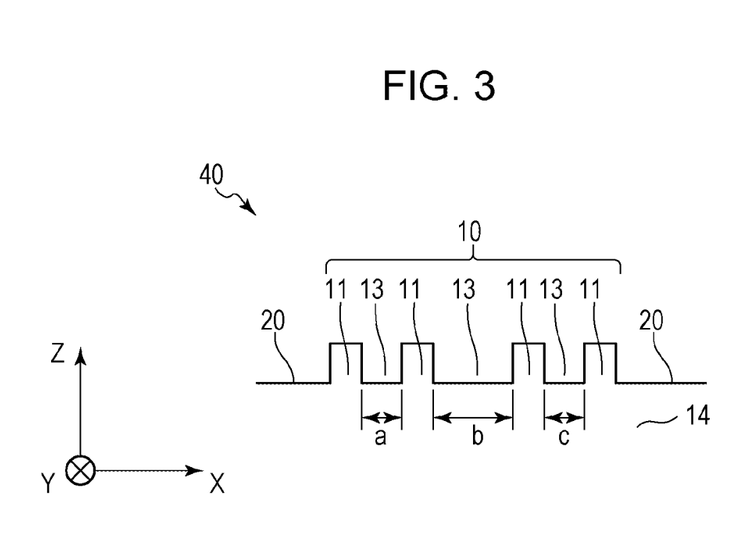
FIG. 3 is an enlarged view of a sectional view of the chuck.

The structure of a chuck 1 and a holding apparatus (substrate-holding apparatus) 100 that holds a substrate according to a first embodiment will be described with reference to FIG. 1, FIG. 2, and FIG. 3. An axis perpendicular to a direction along the front surface of the substrate that is held by the chuck 1 is referred to as a Z-axis, and axes perpendicular to each other in a plane perpendicular to the Z-axis are referred to as an X-axis and a Y-axis. FIG. 1 illustrates the chuck 1 viewed in the direction of +Z. FIG. 2 illustrates the structure of the holding apparatus 100 and includes a sectional view of the chuck 1 taken along line II-II. FIG. 3 is an enlarged view of a region 40 in FIG. 2.

The holding apparatus 100 includes the chuck 1, an exhaust portion 30, and a pipe 31. The exhaust portion 30 exhausts gas from support portions 10 of the chuck 1, and the chuck 1 attracts and holds the substrate that is disposed thereon.

Three openings 25 are formed in a surface 2 of the chuck 1 on which the substrate is to be held. Support pins (not illustrated) that temporally support the substrate when the substrate is loaded into and unload from the holding apparatus 100 project from a base 14 that has the surface 2 through the openings 25.

The chuck 1 includes the support portions 10 that extend from the surface 2 and regions 20 that concentrically alternate. Each support portion 10 includes four convex portions (contact portions) 11 that can be in contact with the substrate and three concave portions 13. The support portion is formed such that the concave portions 13 are located between the corresponding convex portions 11 that are adjacent to each other. In the support portion 10, the four convex portions 11 and the three concave portions 13 are arranged in the direction (one direction) from the center of the chuck 1 toward the outer circumference of the chuck 1, and the three concave portions 13 are lined up in the direction from the center of the chuck 1 toward the outer circumference of the chuck 1 (continuously formed such that no regions 20 are interposed therebetween).

The widths of the three concave portions 13 can be determined without limitation. For example, as illustrated in FIG. 3, the width b of the central concave portion 13 is preferably more than the widths a and c of the concave portions 13 (the other concave portions) on both sides. This enables deformation of the substrate in an out-of-plane direction to be restricted at a position away from the concave portions 13 on both sides.

Each concave portion 13 has at least one opening 12. At least the three concave portions 13 that each support portion 10 includes are connected to the common exhaust portion 30. That is, the openings 12 are common openings for the three concave portions 13. According to the present embodiment, all of the openings 12 are connected to the common exhaust portion 30. The exhaust portion 30 exhausts gas in the concave portions 13 via the openings 12 and the pipe 31. An example of the exhaust portion 30 is a vacuum pump. This enables the substrate to be attracted and held by the support portions 10 with the convex portions 11 being in contact with the substrate. Since the upper surface of each convex portion 11 comes into contact with the substrate, the upper surface is preferably processed so as to have high flatness.

Each region 20 is located between the corresponding support portions 10 and has at least one opening 22. Gas (such as air) in the atmosphere in which the chuck 1 is disposed can enter and exit the openings 22. In this way, the pressure of each concave portion 13 becomes a negative pressure with respect to a space (a space between a first support portion and a second support portion) of an upper part of the corresponding region 20 that corresponds to a side space between the corresponding support portions 10.

When the pressure of each concave portion 13 is a negative pressure with respect to the side space between the support portions 10, the openings 22 may be connected to a gas-supplying portion that supplies a predetermined gas, or gas the pressure of which is adjusted may be supplied.

This prevents portions of the substrate that face the regions 20 from coming into contact with the regions 20 even when the exhaust portion 30 exhausts gas in the concave portions 13. Consequently, the flatness of the substrate is improved, and particles that attach to the substrate can be decreased unlike the case where gas in the spaces of the upper parts of the regions 20 is exhausted. In addition, a suction mark, which can be left when the chuck 1 sucks the substrate too strongly, is not formed on the substrate.

The holding apparatus 100 that has the above structure holds the substrate that is unload. Each support portion 10 has a structure in which the four convex portions 11 and the concave portions 13 that are located between the corresponding convex portions 11 are arranged in one direction, and accordingly, the flatness of the substrate that is held can be improved. In particular, the substrate can be held with high flatness maintained even when the substrate is thin. For example, the chuck 1 is suitable to hold a special substrate that is drilled to such an extent that the thickness of a central portion is equal to about 1/10 of the thickness of an outer circumferential portion.

First Example

An example when the chuck 1 holds a substrate will be described with a comparative example.

Figure 4:
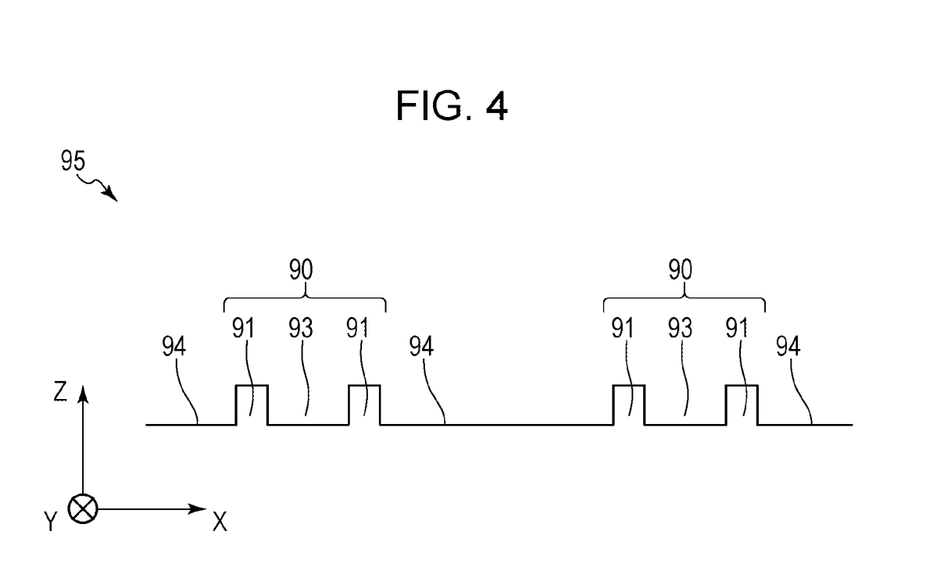
FIG. 4 illustrates the structure of a chuck according to a comparative example.

FIG. 4 is a sectional view of a chuck 95, which differs from the chuck 1 in that support portions 90 that are arranged at a regular interval each include two convex portions 91 and a concave portion 93 therebetween. The support portions 90 are concentrically disposed as with the chuck 1 when the chuck 95 is viewed in the direction of +Z.

Figure 5A:
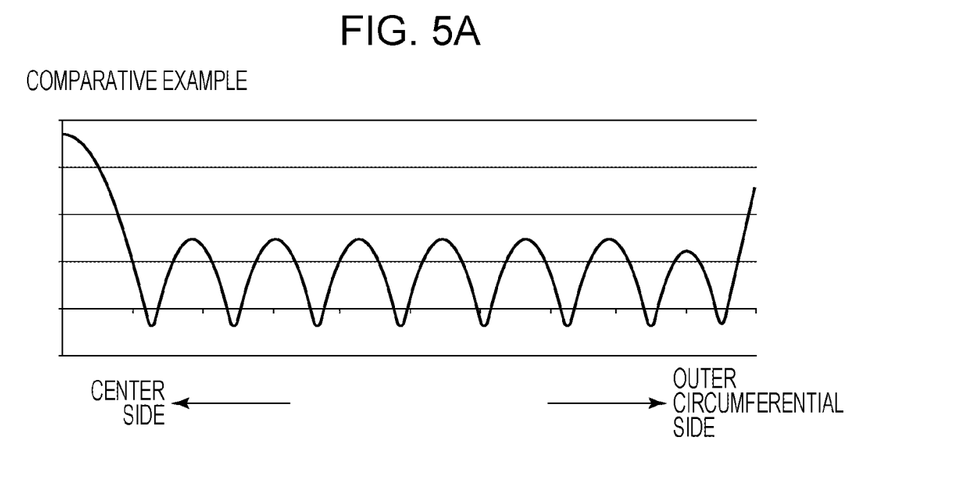
FIG. 5A illustrates the result of a simulation in the case where the chuck in the comparative example is used.
Figure 5B:
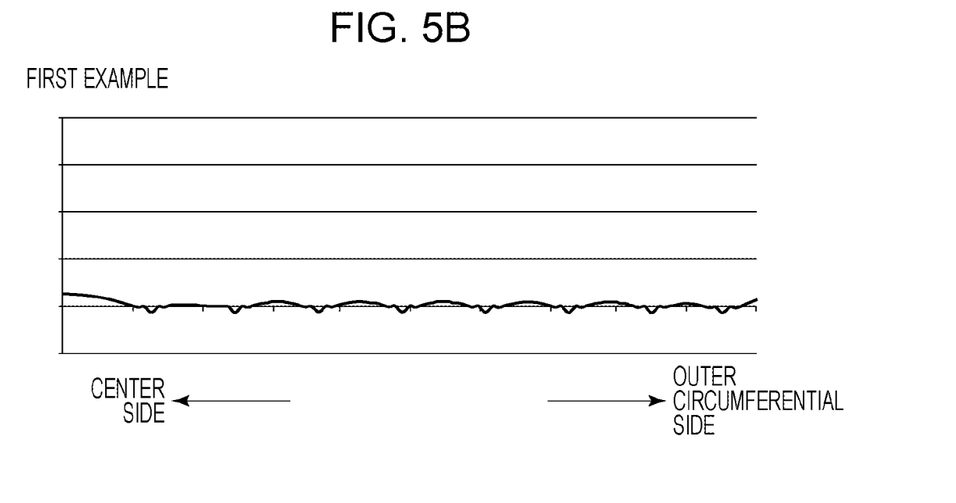
FIG. 5B illustrates the result of a simulation in the case where the chuck according to the first embodiment is used.

FIG. 5A illustrates the result of a simulation of the flatness of the substrate in the case where the chuck 95 in the comparative example is used to hold the substrate. FIG. 5B illustrates the result of a simulation of the flatness of the substrate in the case where the chuck 1 is used to hold the substrate. The vertical axis in FIG. 5A and FIG. 5B represents the position of the back surface of the substrate that is held by each chuck in the height direction, and the horizontal axis represents the position of the chuck in the radial direction. The left end point on the horizontal axis represents the position of the center of the chuck 1. The right end point on the horizontal axis represents the position of the outer circumference thereof.

In the simulations, a suction pressure at the concave portions is 75 kPa, and the thickness of the substrate is 75 μm. The thickness of the substrate is uniform. The chuck 1 and the chuck 95 have the same size. Each chuck has eight of the support portions 10 or the support portions 90.

In the case where the chuck 95 is used to attract and hold the substrate, the position of the back surface of the substrate greatly shifts to an higher position than the position of the other portions at a portion inside the support portion 90 that is nearest to the center of the chuck 95 and at a portion outside the support portion 90 that is nearest to the outer circumference of the chuck 95. That is, a central portion of the substrate and an outer circumference portion of the substrate deform more greatly than the other portions. In addition, the position of the back surface of portions of the substrate between the support portions 90 shifts to a higher position.

In the case where the chuck 1 is used to hold the substrate, the position of the back surface of portions of the substrate does not shift to a higher position unlike the comparative example. In addition, the substrate scarcely deforms between the support portions 10.

Comparing the case of the chuck 1 with the case of the chuck 95, the chuck 1 can hold the substrate with flatness less than 1/10 of flatness in the case of the chuck 95. That is, it is confirmed that the flatness of the substrate that is held can be improved in a manner in which each support portion 10 has the structure in which the four convex portions 11 and the concave portions 13 that are located between the corresponding convex portions 11 are arranged in one direction.

Second Embodiment

Figure 6:
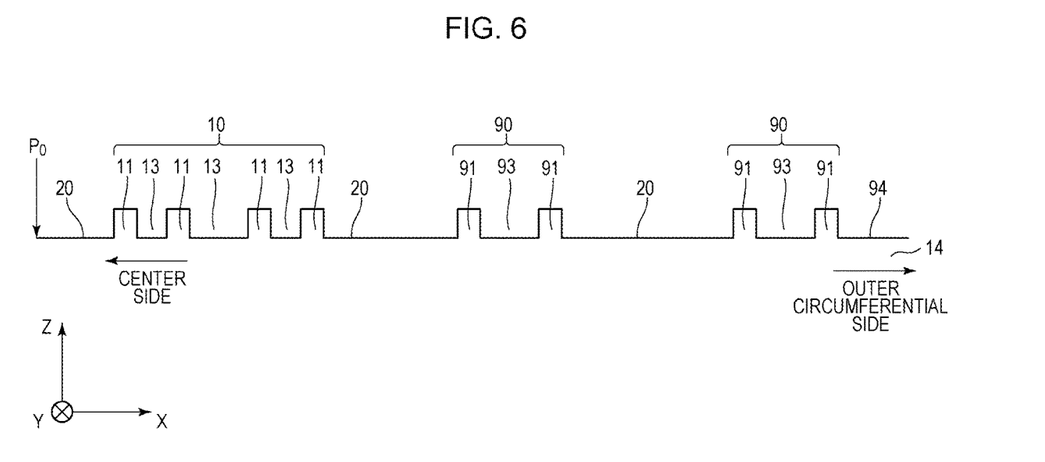
FIG. 6 is an enlarged view of a section of a chuck according to a second embodiment.

FIG. 6 is an enlarged view of a section of a chuck 1 according to a second embodiment. Components like to those in the first embodiment are designated by like reference numbers, and a detailed description thereof is omitted.

In the chuck 1 according to the present embodiment, the support portion 10 includes three concave portions 13, and the other support portions 90 include the concave portion 93. It is not necessary for all of the support portions that support the substrate to include the three the concave portions 13 as in the support portion 10, provided that at least one of the support portions includes the three concave portions 13.

According to the present embodiment, the same effects as in the first embodiment are achieved.

Second Example

In particular, as illustrated in FIG. 6, the support portion that is nearest to the position P0 of the center of the chuck 1 is preferably the support portion 10.

Figure 7:
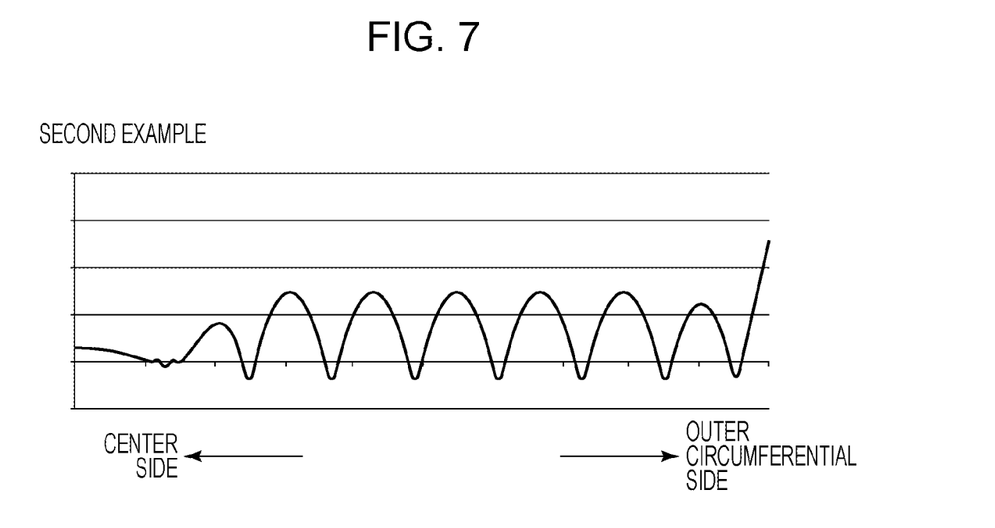
FIG. 7 illustrates the position of the back surface of a substrate that is held by the chuck according to the second embodiment.

FIG. 7 illustrates the result of a simulation representing the position of the back surface of a substrate that is held by the chuck 1 according to the second embodiment. The conditions of the simulation and the axes are the same as described above except that the structure of the chuck 1 is changed, and a detailed description thereof is omitted.

The deformation of the central portion of the substrate, which notably appears in the comparative example described above, can be greatly inhibited in a manner in which the support portion 10 is merely disposed at the position nearest to the center of the chuck 1. The substrate can be held so as to have good flatness.

Alternatively, the support portion that is nearest to the outer circumference of the chuck 1 may be the support portion 10 instead of the support portion that is nearest to the center of the chuck 1. Alternatively, the support portion that is nearest to the center of the chuck 1 and the support portion that is nearest to the outer circumference of the chuck 1 may be the support portions 10. This enables the flatness of the substrate that is held to be improved.

Third Embodiment

Figure 8:
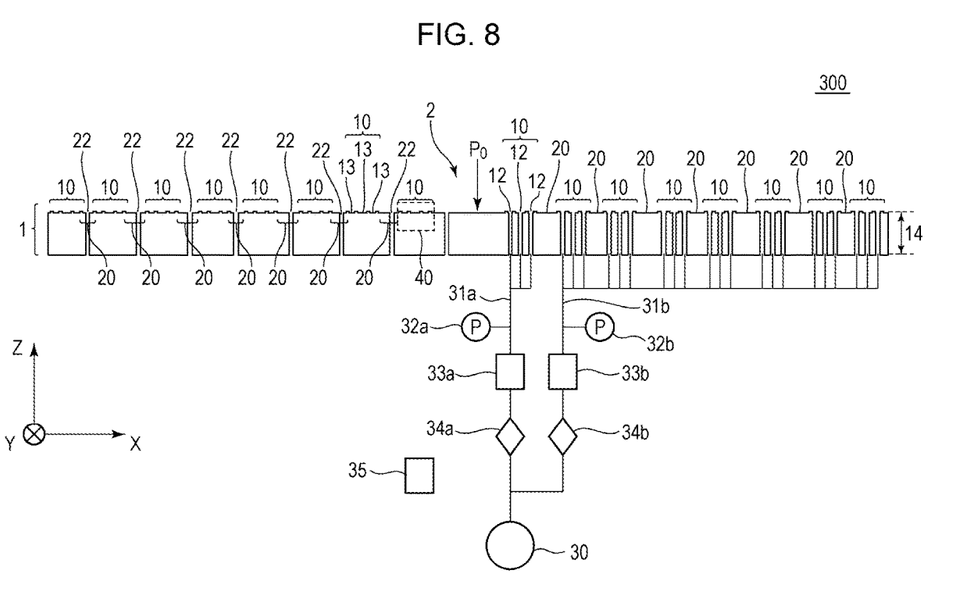
FIG. 8 illustrates the structure of a holding apparatus according to a third embodiment.

FIG. 8 illustrates the structure of a holding apparatus 300 according to a third embodiment and includes a sectional view of the chuck 1. Components like to those in the first embodiment are designated by like reference numbers, and a detailed description thereof is omitted. The holding apparatus 300 controls an exhaust unit by using a control unit 35 to separately control the suction pressure applied at the support portion 10 (some of the support portions) that is nearest to the position P0 of the center of the chuck 1 and the suction pressure of the substrate applied at the other support portions 10.

The holding apparatus 300 includes the exhaust portion 30, pipes 31a and 31b, pressure gauges 32a and 32b, solenoid valves 33a and 33b, and adjusters 34a and 34b that serve as the exhaust unit.

The pressure gauge 32a measures the pressure of the inside of the pipe 31a. The pressure gauge 32b measures the pressure of the inside of the pipe 31b. The solenoid valve 33a switches between ON and OFF of exhaust of the pipe 31a. The solenoid valve 33b switches between ON and OFF of exhaust of the pipe 31b. The adjuster 34a adjusts the pressure of the inside of the pipe 31a. The adjuster 34b adjusts the pressure of the inside of the pipe 31b. The control unit 35 controls the solenoid valves 33a and 33b and the adjusters 34a and 34b.

For simplicity of description, in the case described below, the control unit 35 controls the adjuster 34b such that a predetermined pressure of the inside of the pipe 31b is maintained, and only the pressure of the inside of the pipe 31a is changed.

Figure 9:
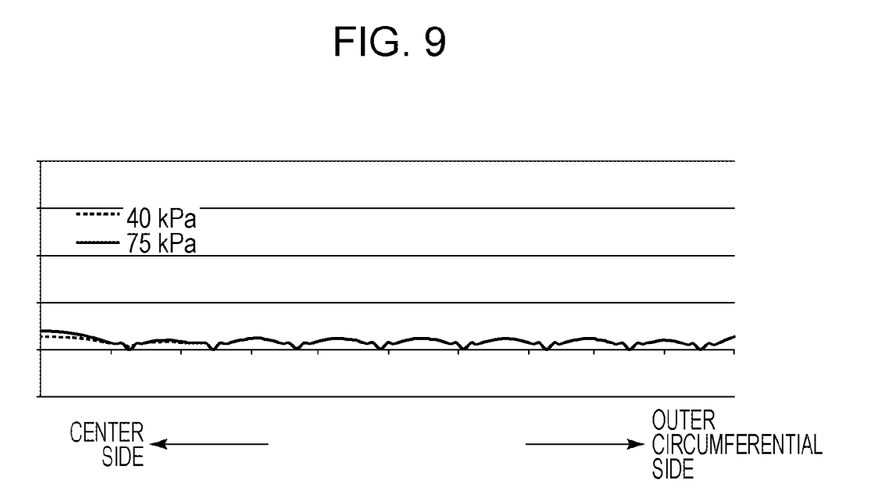
FIG. 9 illustrates the position of the back surface of a substrate that is held by the chuck according to the third embodiment.

FIG. 9 illustrates the result of a simulation representing the position of the back surface of a substrate that is held by the chuck 1 according to the third embodiment. The conditions of the simulation and the axes are the same as described above except that the structure of the chuck 1 is changed, and a detailed description thereof is omitted.

The control unit 35 controls the pressure of the inside of the pipe 31a on the basis of information about the flatness of the central portion of the substrate. A solid line represents the position of the back surface of the substrate in the height direction in the case where the substrate is held with a suction pressure of 75 kPa applied at all of the support portions 10. A dashed line represents the position of the back surface of the substrate in the height direction in the case where the suction pressure applied at the support portion 10 that is nearest to the position P0 of the center of the chuck 1 is decreased to 40 kPa.

As illustrated in FIG. 9, it is made clear that a change in the suction pressure enables the position of the back surface of the central portion of the substrate to be changed.

For example, in the case where the central portion of the substrate that is held has a thickness less than that of the outer circumferential portion and the position of the front surface thereof in the height direction is likely to shift to a lower position, a suction force at the first support portion is preferably adjusted to 75 kPa in advance. The position of the back surface can be higher than that at the outer circumferential portion in advance, and the flatness of the front surface of the substrate can be improved.

The holding apparatus 300 also achieves the same effects as in the first embodiment. In addition, degradation of the flatness due to distribution of the thickness of the substrate can be compensated in a manner in which the pressure of the pipe 31a is controlled to control the position of the back surface of the substrate.

The control unit 35 may obtain the information about the flatness on the basis of the result of measurement of the thickness with another measuring instrument before loading onto the holding apparatus 300 or may obtain the information about the flatness by measuring the position of the front surface of the substrate with ultrasonic waves or light after loading onto the holding apparatus 300. Alternatively, information inputted from a user may be obtained as the information about the flatness of the substrate.

The control of the suction pressure by the control unit 35 includes switching between ON and OFF of exhaust by control of the solenoid valves 33a and 33b. The suction pressure may be continuously controlled for the pipe 31b.

Fourth Embodiment

Figure 10:
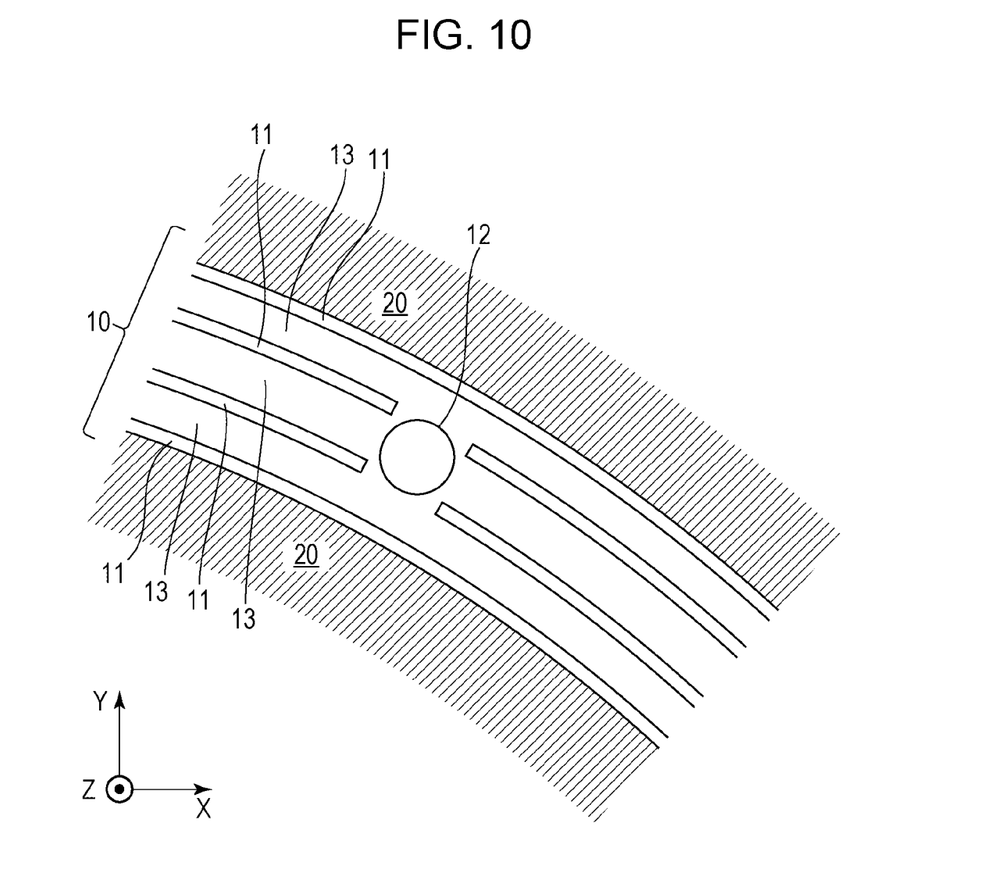
FIG. 10 illustrates a chuck according to a fourth embodiment viewed in the direction of +Z.

FIG. 10 is an enlarged view of a chuck 1 according to a fourth embodiment viewed in the direction of +Z and illustrates a portion thereof that includes the support portion 10. Components like to those in the first embodiment are designated by like reference numbers, and a detailed description thereof is omitted. Gas in the three concave portions 13 may be exhausted through the opening 12.

The chuck 1 can achieve the same effects as in the first embodiment. The chuck 1 is suitable for the case where it is difficult to form the openings 12 corresponding to the respective concave portions 13 because the widths a, b, and c of the concave portions 13 are narrow.

Fifth Embodiment

Each support portion 10 may not have the structure in which the four convex portions 11 and the three concave portion 13 are arranged in one direction but may have a structure in which three convex portions 11 and two concave portions 13 are arranged in one direction.

One or more support portions 10 preferably have the structure in which the three convex portions 11 and the two concave portions 13 are arranged in one direction. In the case where the chuck 1 includes three or more support portions, at least one of the support portions other than the support portion that is nearest to the center of the chuck 1 and the support portion that is nearest to the outer circumference of the chuck 1 may be the support portion 10. The support portion that is nearest to the center of the chuck 1, the support portion that is nearest to the outer circumference of the chuck 1, and the at least one of the other support portions are more preferably the support portions 10 that have the structure in which the three convex portions 11 and the two concave portions 13 are arranged in one direction.

The chuck 1 according to the present embodiment can improve the flatness of the substrate that is held more than the case of the chuck 95.

Sixth Embodiment

Figure 11:
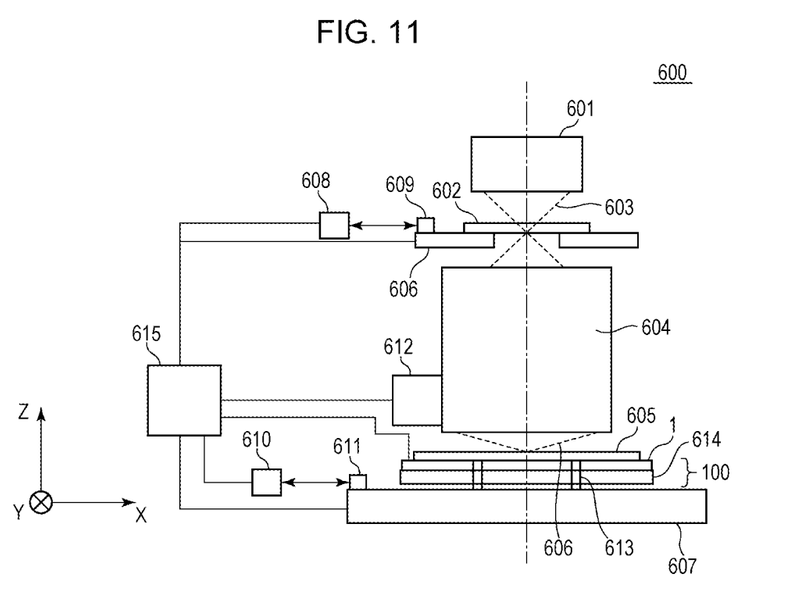
FIG. 11 illustrates the structure of an exposure device.

An embodiment of a lithography apparatus (pattern-forming apparatus) that is equipped with the holding apparatus 100 according to the first embodiment will be described. FIG. 11 illustrates the structure of an exposure device 600 that corresponds to the lithography apparatus. An axis parallel to an optical axis (vertical direction according to the present embodiment) of a projection optical system 604 is referred to as the Z-axis. Axes perpendicular to each other in a plane perpendicular to the Z-axis are referred to as the X-axis and the Y-axis.

The exposure device 600 illuminates a reticle (original) 602 with illumination light 603 via an illumination optical system 601 to cast an image of a pattern that is formed on the reticle 602 illuminated on a substrate 605 via the projection optical system 604. A stage 606 holds the reticle 602 and causes the reticle 602 to be scanned in the direction of the X-axis. A stage 607 moves the chuck 1 and the substrate 605 that is held by the chuck 1 by using a driving mechanism (not illustrated) such as a linear motor.

The exposure device 600 causes the reticle 602 and the substrate 605 to be relatively scanned by using the stages 606 and 607 and forms a latent image pattern on a resist that is applied to the substrate 605. An interferometer 608 radiates a laser beam to a mirror 609, and an interferometer 610 radiates a laser beam to a mirror 611. The reflected light thereof is received to detect the position of the reticle 602 and the substrate 605. A detector 612 detects an alignment mark (not illustrated) that is formed on the substrate 605 and a reference mark (not illustrated) that is formed on the stage 607.

The holding apparatus 100 includes a top plate 614 that includes pins 613 for supporting the substrate 605 when the substrate 605 is load and unload, and a lifting mechanism (not illustrated) that lifts and lowers the chuck 1 and the top plate 614 with respect to the pins 613 in addition to the above components.

A control unit 615 is connected to the stages 606 and 607, the detector 612, the interferometers 608 and 610, and the holding apparatus 100 and comprehensively controls these. For example, during an exposure process, the position at which the pattern is formed is determined on the basis of the detection result of the detector 612, and the stages 606 and 607 are controlled on the basis of information about the position that is obtained from the interferometers 608 and 610. The control unit 615 controls movement of the lifting mechanism and the stage 607 of the holding apparatus 100 when the substrate 605 is loaded and unload. The control unit 615 may be disposed in a housing that accommodates the other components other than the control unit 615 or may be disposed in another housing that differs from the above housing.

The holding apparatus 100 enables the flatness of the substrate 605 to be improved unlike the case where a holding apparatus that uses a support portion that does not include the three concave portions 13. Accordingly, exposure is facilitated while the position of the front surface of the substrate 605 is adjusted to the position of focus of exposure light 616. This inhibits degradation of resolution of the pattern that is formed on the substrate 605. The resolution can be degraded when the flatness of the substrate 605 is not good.

The exposure device 600 may be equipped with the chuck 1 according to any one of the second to fifth embodiments or the holding apparatus 100 or 300.

Light radiated by the exposure device 600 toward the substrate 605 is not limited to i-line (a wavelength of 365 nm) and may be ultraviolet light such as KrF light (a wavelength of 248 nm) or ArF light (a wave length of 193 nm) or visible light such as g-line (a wave length of 436 nm). The lithography apparatus according to the embodiment of the present invention may be an apparatus that forms a pattern of a resist (imprinting material) on a substrate by an imprinting method or an apparatus that prints a latent image pattern on a wafer by radiating a laser beam or a charged particle beam to the substrate.

Other Embodiments

The shape of each support portion 10 of the chuck 1 is not necessarily a continuous circular shape (annular shape) but may be a continuous rectangular shape (rectangular frame shape). FIG. 1 illustrates the support portions 10 that are concentric, that is, the annular support portions 10 are arranged in a multiple arrangement in the direction along the substrate that is held by the chuck 1 but may not be arranged in this way.

Figure 12:
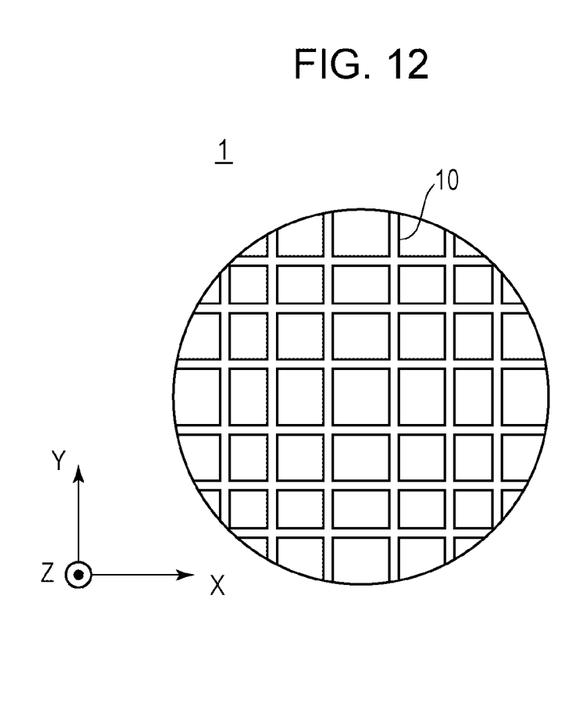
FIG. 12 illustrates another structure of a chuck.

As illustrated in FIG. 12, the shapes of the support portions 10 may be obtained from a combination of linear support portions 10 that divide the surface 2 into rectangular regions. A combination of the linear support portions 10 and the annular support portions 10 is also acceptable. In FIG. 12, an illustration of the concave portions 13 and the openings 12 that are included in the support portions 10 is omitted.

As described according to the embodiments, the number of the support portions 10 may be plural. A continuous support portion 10 may be arranged in a multiple arrangement along the front surface of the substrate that is held by the chuck 1.

The support portions 10 may be integrally molded with the base 14 that has the surface 2 or may be separated from the base 14. The height of the bottom of each concave portion 13 may be the same as the height of the surface 2 or may be higher than the height of the surface 2.

The third embodiment may be appropriately combined with the chuck 1 according to any one of the other embodiments and carried out. The arrangement of the opening 12 described according to the fourth embodiment may be appropriately combined with the chuck 1 according to any one of the other embodiments.

Method of Manufacturing Article

The pattern that is formed on the substrate by using the lithography apparatus (pattern-forming apparatus) is temporally used when various articles are manufactured. Examples of the articles include an electrical circuit element, an optical element, MEMS, a print element, a sensor, and a mold. Examples of the electrical circuit element include nonvolatile or volatile semiconductor memories such as a DRAM, a SRAM, a flash memory, and a MRAM, and semiconductor elements such as a LSI chip, a CCD, and an image sensor, and a FPGA. Examples of the mold include a mold for imprinting.

The pattern that is formed by using the lithography apparatus is etched or subjected to an ion implantation process during processing of the substrate, and subsequently, a resist used as a mask is removed. In the case where the exposure device or a drawing apparatus is used as the lithography apparatus, the resist is developed before processing described above. A solidified pattern of the resist that is formed by using an imprinting apparatus as the lithography apparatus may be used as a component of at least part of the above article.

Preferred embodiments of the present invention are described above. It goes without saying that the present invention is not limited to the embodiments. Various modifications and alterations can be made within the range of the spirit thereof.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

Industrial Applicability

The invention claimed is:

1. A chuck comprising:
   first and second support portions each of which has a repetition structure of a convex portion and a concave portion on a base,
   wherein at least one support portion of the first support portion and the second support portion includes at least four of the convex portions and three concave portions, and
   wherein a substrate is held by bringing each convex portion into contact with the substrate and exhausting gas in each concave portion such that a pressure with respect to three of spaces surrounded by the substrate and the three concave portions is lower than a pressure with respect to a space surrounded by the substrate and a concave portion between the first support portion and the second support portion.

2. The chuck according to claim 1, wherein the four convex portions and the three concave portions are arranged in a direction from a center of the chuck toward an outer circumference of the chuck.

3. The chuck according to claim 2, wherein a width of a central concave portion of the three concave portions in the direction is more than widths of the other two concave portions of the three concave portions.

4. The chuck according to claim 1, further comprising: a plurality of support portions each of which has the repetition structure on the base, wherein the at least one support portion is located nearer than the plurality of support portions to a center of the chuck.

5. The chuck according to claim 1, wherein the first and second support portions have an annular shape and are arranged on the base in a multiple arrangement.

6. The chuck according to claim 1, wherein an opening for exhausting the gas in the three concave portions is a common opening.

7. The chuck according to claim 1, wherein the base and the first and second support portions are integrally molded.

8. The chuck according to claim 1, further comprising:
   an opening provided to each of the three concave portions and configured to exhaust gas in the three of spaces which are surrounded by the substrate and each of the three concave portions.

9. The chuck according to claim 1, further comprising:
   an opening provided between the first support portion and the second support portion and configured to supply gas in the space surrounded by the substrate and the concave portion between the first support portion and the second support portion.

10. The chuck according to claim 9, wherein the opening is connected to a gas-supplying portion that supplies gas.

11. A substrate-holding apparatus for holding a substrate, comprising:
    a chuck including first and second support portions each of which has a repetition structure of a convex portion and a concave portion on a base; and
    an exhaust portion configured to exhaust the gas in each concave portion of the chuck to hold the substrate,
    wherein at least one support portion of the first support portion and the second support portion includes at least four of the convex portions and three concave portions, and
    wherein a substrate is held by bringing each convex portion into contact with the substrate and exhausting gas in each concave portion such that a pressure with respect to three of spaces surrounded by the substrate and the three concave portions is lower than a pressure with respect to a space surrounded by the substrate and a concave portion between the first support portion and the second support portion.

12. The substrate-holding apparatus according to claim 11, wherein the exhaust portion adjusts pressures of the concave portion of the first support portion and the concave portion of the second support portion to different pressures on a basis of information about flatness of the substrate.

13. The substrate-holding apparatus according to claim 12, wherein the information is about distribution of a thickness of the substrate.

14. A pattern-forming apparatus for forming a pattern on a substrate with an original, comprising:
    a chuck including first and second support portions each of which has a repetition structure of a convex portion and a concave portion on a base; and
    an exhaust portion configured to exhaust the gas in each concave portion of the chuck to hold the substrate,
    wherein at least one support portion of the first support portion and the second support portion includes at least four of the convex portions and three concave portions, and
    wherein a substrate is held by bringing each convex portion into contact with the substrate and exhausting gas in each concave portion such that a pressure with respect to three of spaces surrounded by the substrate and the three concave portions is lower than a pressure with respect to a space surrounded by the substrate and a concave portion between the first support portion and the second support portion.

15. A method of manufacturing an article, comprising:
    a step of forming a pattern on a substrate with a pattern-forming apparatus for forming a pattern on a substrate with an original; and
    a step of processing the substrate on which the pattern is formed to manufacture the article,
    wherein the pattern-forming apparatus includes:

a chuck including first and second support portions each of which has a repetition structure of a convex portion and a concave portion on a base; and an exhaust portion configured to exhaust the gas in each concave portion of the chuck to hold the substrate, wherein at least one support portion of the first support portion and the second support portion includes at least four of the convex portions and three concave portions, and wherein a substrate is held by bringing each convex portion into contact with the substrate and exhausting gas in each concave portion such that a pressure with respect to three of spaces surrounded by the substrate and the three concave portions is lower than a pressure with respect to a space surrounded by the substrate and a concave portion between the first support portion and the second support portion.

16. A chuck for holding a substrate, the chuck comprising:

first and second support portions each of which has a repetition structure of a convex portion and a concave portion on a base, wherein at least one support portion of the first support portion and the second support portion includes at least four of the convex portions and three concave portions;

a first opening provided to each of the three concave portions and configured to exhaust gas in the three of spaces which are surrounded by the substrate and each of the three concave portions; and a second opening provided between the first support portion and the second support portion and configured to supply gas in the space surrounded by the substrate and a concave portion between the first support portion and the second support portion.

17. A chuck for holding a substrate comprising:

first and second support portions each of which has an annular shape and is arranged on a base, wherein at least one support portion of the first support portion and the second support portion includes at least four of the convex portions and three concave portions, and wherein a substrate is held by bringing each convex portion into contact with the substrate and exhausting gas in each concave portion such that a pressure with respect to three of spaces surrounded by the substrate and the three concave portions is lower than a pressure with respect to a space surrounded by the substrate and a concave portion between the first support portion and the second support portion.

18. The chuck according to claim 17, wherein each of the first and second support portions is arranged on the base in a multiple arrangement.

19. The chuck according to claim 17, further comprising:

an opening provided to each of the three concave portions and configured to exhaust gas in the three of spaces which are surrounded by the substrate and each of the three concave portions.

20. The chuck according to claim 17, further comprising:

an opening provided between the first support portion and the second support portion and configured to supply gas in the space surrounded by the substrate and the concave portion between the first support portion and the second support portion.

21. A substrate-holding apparatus for holding a substrate, comprising:

a chuck including first and second support portions each of which has an annular shape and is arranged on a base; and an exhaust portion configured to exhaust the gas in each concave portion of the chuck to hold the substrate, wherein at least one support portion of the first support portion and the second support portion includes at least four of the convex portions and three concave portions, and wherein a substrate is held by bringing each convex portion into contact with the substrate and exhausting gas in each concave portion such that a pressure with respect to three of spaces surrounded by the substrate and the three concave portions is lower than a pressure with respect to a space surrounded by the substrate and a concave portion between the first support portion and the second support portion.

22. A pattern-forming apparatus for forming a pattern on a substrate with an original, comprising:

a chuck including first and second support portions each of which an annular shape and is arranged on a base; and an exhaust portion configured to exhaust the gas in each concave portion of the chuck to hold the substrate, wherein at least one support portion of the first support portion and the second support portion includes at least four of the convex portions and three concave portions, and wherein a substrate is held by bringing each convex portion into contact with the substrate and exhausting gas in each concave portion such that a pressure with respect to three of spaces surrounded by the substrate and the three concave portions is lower than a pressure with respect to a space surrounded by the substrate and a concave portion between the first support portion and the second support portion.

23. A method of manufacturing an article, comprising:

a step of forming a pattern on a substrate with a pattern-forming apparatus for forming a pattern on a substrate with an original; and a step of processing the substrate on which the pattern is formed to manufacture the article, wherein the pattern-forming apparatus includes:

a chuck including first and second support portions each of which has an annular shape and is arranged on a base; and an exhaust portion configured to exhaust the gas in each concave portion of the chuck to hold the substrate, wherein at least one support portion of the first support portion and the second support portion includes at least four of the convex portions and three concave portions, and wherein a substrate is held by bringing each convex portion into contact with the substrate and exhausting gas in each concave portion such that a pressure with respect to three of spaces surrounded by the substrate and the three concave portions is lower than a pressure with respect to a space surrounded by the substrate and a concave portion between the first support portion and the second support portion.

* * * * *